(12) United States Patent
Park et al.

(10) Patent No.: US 8,647,707 B2
(45) Date of Patent: Feb. 11, 2014

(54) METHOD OF FORMING PATTERN AND METHOD OF MANUFACTURING ORGANIC LIGHT EMITTING DEVICE

(75) Inventors: Jae-Seok Park, Yongin (KR); Hyun-Chul Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 341 days.

(21) Appl. No.: 12/969,727

(22) Filed: Dec. 16, 2010

(65) Prior Publication Data

US 2011/0159201 A1 Jun. 30, 2011

(30) Foreign Application Priority Data

Dec. 29, 2009 (KR) .................. 10-2009-0132824

(51) Int. Cl.
*B05D 5/06* (2006.01)
*B05D 5/00* (2006.01)
*C23C 16/00* (2006.01)
*H01L 21/00* (2006.01)

(52) U.S. Cl.
USPC ............ 427/69; 427/66; 427/256; 118/726; 438/29

(58) Field of Classification Search
USPC ............ 427/66, 69, 256; 118/726; 438/29
See application file for complete search history.

(56) References Cited

U.S. PATENT DOCUMENTS

| | | | |
|---|---|---|---|
| 5,937,272 A * | 8/1999 | Tang | 438/30 |
| 2003/0148021 A1* | 8/2003 | Ishizuka | 427/66 |
| 2008/0226814 A1 | 9/2008 | Kawamura et al. | |
| 2009/0011677 A1* | 1/2009 | Ikeda et al. | 445/24 |
| 2009/0038550 A1 | 2/2009 | Higo | |

FOREIGN PATENT DOCUMENTS

| | | |
|---|---|---|
| JP | 2000-150150 | 5/2000 |
| JP | 2001-295027 | 10/2001 |
| JP | 2002-302759 | 10/2002 |
| JP | 2008-174783 | 7/2008 |
| KR | 10-2004-0080963 | 9/2004 |
| KR | 10-2005-0014716 | 2/2005 |
| KR | 10-2006-0018159 | 2/2006 |
| KR | 10-2007-0038640 | 4/2007 |
| KR | 10-2009-0015805 | 2/2009 |

OTHER PUBLICATIONS

KIPO Office action dated Apr. 22, 2011, for Korean priority Patent application 10-2009-0132824.

(Continued)

*Primary Examiner* — James Lin
(74) *Attorney, Agent, or Firm* — Christie, Parker & Hale, LLP

(57) ABSTRACT

A method of forming a pattern includes: providing a heating substrate that selectively controls positions where heat is generated by controlling locations where electric current flows; forming a pattern forming material on a surface of the heating substrate; aligning a patterning substrate, on which a pattern may be formed, to face a surface of the heating substrate; and selectively applying electric current to the heating substrate to transfer some of the pattern forming material onto the patterning substrate. According to the method of forming the pattern and a method of fabricating an OLED, the pattern is transferred by heating the pattern forming material formed on the heating substrate, and thus, the pattern may be formed with high accuracy without using a mask, and the pattern forming material remaining on the heating substrate may be re-used.

15 Claims, 4 Drawing Sheets

(56) References Cited

OTHER PUBLICATIONS

Patent Abstracts of Japan, and English machine translation for Japanese Publication 2000-150150, 28 pages.

Korean Determination Certificate dated Sep. 28, 2012 issued to Korean priority patent application No. 10-2009-0132824, 5 pages.
Japan Office Action dated Dec. 6, 2011 corresponding to Japanese Patent Application No. 2010-149903, 3 pages.

* cited by examiner

METHOD OF FORMING PATTERN AND METHOD OF MANUFACTURING ORGANIC LIGHT EMITTING DEVICE

CROSS-REFERENCE TO RELATED APPLICATION

This application claims the benefit of Korean Patent Application No. 10-2009-0132824, filed Dec. 29, 2009 in the Korean Intellectual Property Office, the disclosure of which is incorporated herein by reference.

BACKGROUND

1. Field

One or more embodiments of the present invention relate to a method of forming patterns and a method of manufacturing an organic light emitting device, and more particularly, to a method of forming patterns by using electric resistance heat generating on a heating substrate, and a method of manufacturing an organic light emitting device.

2. Description of the Related Art

Electroluminescence devices are self-emissive display devices and are considered as a next generation display device because of excellent characteristics thereof. For example, electroluminescence devices have an excellent wide viewing angle, high contrast, and fast response speed.

Electroluminescent devices may be classified as inorganic electroluminescent devices and organic electroluminescent devices according to a material forming a light emission layer. In organic electroluminescent devices, an organic light emitting material is deposited in a vacuum atmosphere by using a mask having a predetermined pattern in order to form an organic layer. When patterning the organic layer using the mask, the technology of patterning the organic layer that is the light emission layer is very important in the entire processes of manufacturing full-color organic electroluminescent devices.

In the manufacturing process of the organic electroluminescent device, a large substrate is generally used to manufacture many organic electroluminescent devices through a one-time process. Also, as a demand for a large display increases, the size of a display itself increases as well. However, since the large substrate sags due to the gravity in the deposition process as the size thereof increases, it is difficult to increase a degree of precision of a pattern when the organic light emitting material is deposited by using the mask.

SUMMARY

One or more embodiments of the present invention include a method of forming a pattern which may form a pattern with high precision by transferring a pattern forming material using a heating substrate to remove a sagging phenomenon of the substrate, which may be generated when the pattern is formed on a large size substrate, and a method of manufacturing an organic light emitting device.

One or more embodiments of the present invention include a method of forming a pattern which may be suitable for forming a pattern on a large substrate, and a method of manufacturing an organic light emitting device.

According to one or more embodiments of the present invention, a method of forming a pattern, the method includes: providing a heating substrate that selectively controls positions where heat is generated by controlling locations where electric current flows; forming a pattern forming material on a surface of the heating substrate; aligning a patterning substrate, on which a pattern may be formed, to face a surface of the heating substrate; and selectively applying electric current to the heating substrate to transfer some of the pattern forming material onto the patterning substrate.

According to one or more embodiments of the present invention, a method of fabricating an organic light emitting device (OLED), the method includes: providing a heating substrate that selectively controls positions where heat is generated by controlling locations where electric current flows; forming a pattern forming material on a surface of the heating substrate; aligning a patterning substrate, on which a plurality of pixel electrodes are formed, to face a surface of the heating substrate; and selectively applying electric current to the heating substrate to transfer some of the pattern forming material onto the patterning substrate.

Other aspects, features, and advantages of the embodiments of the present invention will be clear from drawings, claims, and detailed description of the invention.

According to embodiments of the present invention, the pattern is transferred by heating the pattern forming material formed on the heating substrate, and thus, the pattern may be formed on the large substrate with high accuracy without using a mask. In addition, the pattern forming material remaining on the heating substrate after the process may be re-used.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
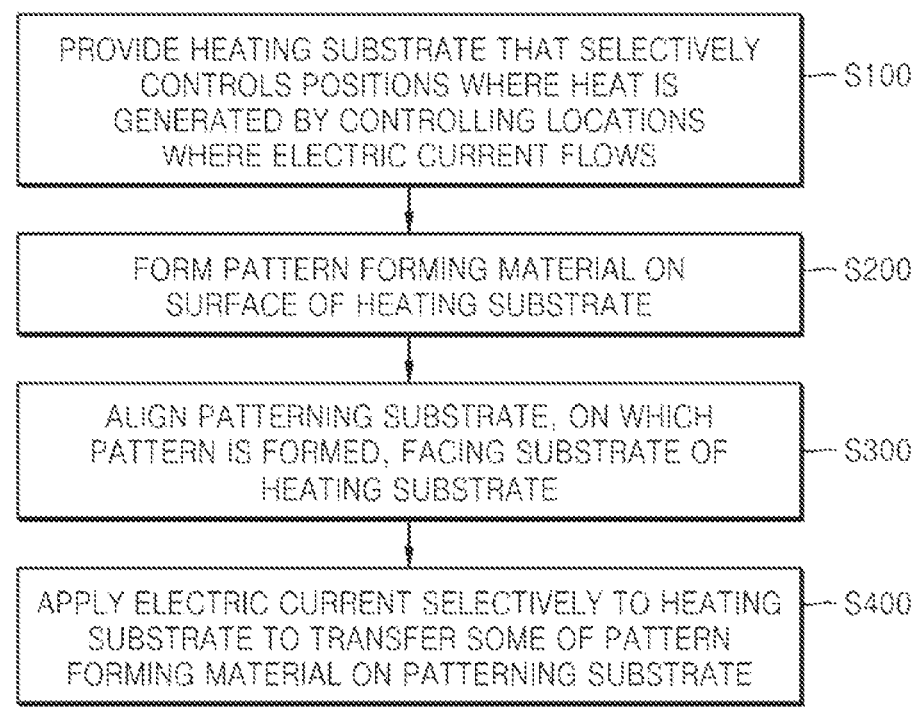
FIG. 1 is a flowchart illustrating a method of forming patterns according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The terms used in the present specification are used for explaining a specific exemplary embodiment, not limiting the present inventive concept. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

The method of forming a pattern and the method of manufacturing an organic light emitting device according to the present invention will be described in detail with reference to FIGS. 1 through 7. FIG. 1 is a flowchart illustrating the method of forming a pattern according to an embodiment of the present invention, and FIGS. 2 through 7 are flow diagrams illustrating the method of forming a pattern according to an embodiment of the present invention.

Figure 2:
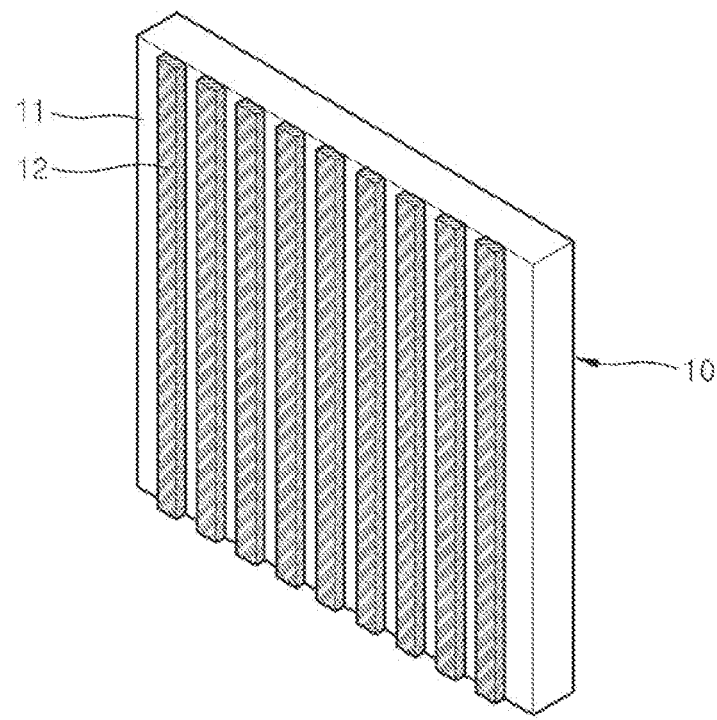
FIGS. 2 through 7 are diagrams illustrating processes of forming patterns according to an embodiment of the present invention.

Referring to FIGS. 1 and 2, a heating substrate 10 is prepared in operation S100. Here, the heating substrate 10 generates heat according to flow of electric current, and may control the generated heat by controlling the flow of electric current. While not required in all aspects, as shown in FIG. 2, the heating substrate 10 is formed by coupling a plurality of electric heating lines 12 onto a substrate 11. The electric heating lines 12 may be attached to the substrate 11, wound on the substrate 11, or may be embedded in the substrate 11. The substrate 11 may be formed of a glass material or an insulating material. In addition, the electric heating lines 12 may be formed of an alloy of iron (Fe) and chromium (Cr) or an alloy of nickel (Ni) and Cr, which generates the heat by the flow of the electric current and an electrical resistance of the heating lines 12. The electric current respectively flows in each of the plurality of electric heating lines 12, and the flow of electric current may be controlled by a selection of a user manufacturing organic light emitting device. While described in terms of using electrical resistance to provide heat, it is understood that the lines 12 could generate or transfer heat using other mechanisms. For instance, the lines 12 could generate heat using as chemical reactions, transport heated materials within the lines 12, conduct from a heat source, and/or use other electrical mechanisms usable to generate heat such as induction.

The position where the current flows may be selectively controlled due to the structure of the heating substrate 10. Accordingly, the electric resistance heat generated in the heating substrate 10 may be selectively generated at a position corresponding to the current flowing position. The magnitude of the heat generated in the heating substrate 10 may be adjusted according to the thickness of the electric heating lines 12 coupled to the heating substrate 10 or the amount of current flowing through the electric heating lines 12. That is, as the electric heating lines 12 are designed to be thicker or the amount of current flowing through the electric heating lines 12 increases, the magnitude of the electric resistance heat selectively generated in the heating substrate 10 may be increased. When the heating substrate 10 of large area is used, the thicknesses of the electric heating lines 12 may vary according to locations thereof or resistances of the electric heating lines 12 may be differentiated from each other in order to control the temperature of the heat generated on a front surface of the substrate to be constant. As shown, the heating lines 12 are parallel lines, but it is understood that the lines 12 can be non-linear, need not be continuous, and need not be parallel in all aspects.

The pattern of the electric heating lines 12 may be formed in relation to a pattern to be formed on a patterning substrate 20 which will be described later.

Figure 3:
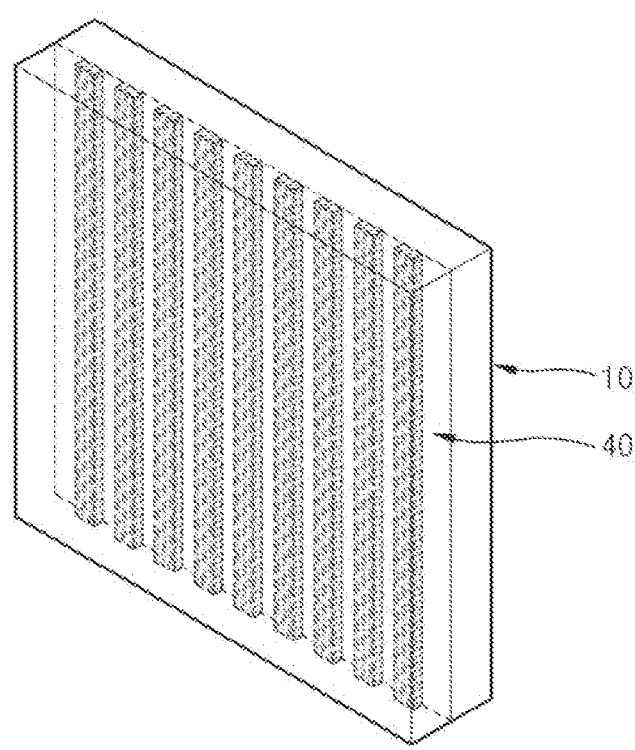

Next, as shown in FIGS. 1 and 3, a pattern forming material 40 is deposited on a surface of the heating substrate 10 in operation S200. The pattern forming material is transferred on a surface of the patterning substrate 20 to form a pattern in a patterning process that will be described later. The pattern forming material 40 of the present embodiment is an organic compound which may form an organic light emitting layer on the patterning substrate formed of low temperature poly-silicon in order to fabricate an organic light emitting device (OLED). In particular, a material emitting one of red, green, and blue colors may be used in order to emit color lights from the OLED. The color of the light emitted from the OLED may be determined according to the selected organic compound.

The pattern forming material 40 may be provided on a surface of the heating substrate 10 in a deposition method or a sputtering method. That is, the pattern forming material 40 is vacuum-deposited or sputtered on the surface of the heating substrate 10, and thus, the pattern forming material 40 may be applied on the entire surface of the heating substrate 10. FIG. 3 shows that the pattern forming material 40 applied on the surface of the heating substrate 10 in the depositing or sputtering method. However, it is understood that other mechanisms can be used to apply the pattern forming material 40, such as spin coating.

Figure 4:
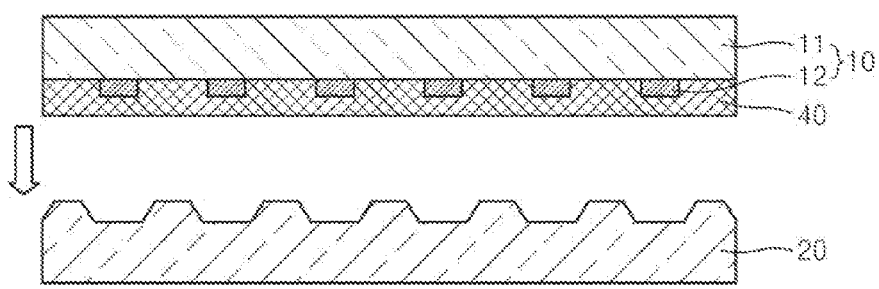

In addition, as shown in FIGS. 1 and 4, the patterning substrate 20 for forming the pattern is aligned to face the surface of the heating substrate 10, on which the pattern forming material 40 is stacked in operation S300. According to an embodiment of the present invention, the patterning substrate 20 may be a low temperature poly-silicon (LTPS) substrate that may be used to manufacture the OLED. In the shown embodiment, the LTPS substrate is a large substrate in which a plurality of OLEDs may be formed and is the patterning substrate 20 where a pattern layer of an organic compound is formed by a below-described process.

Figure 5:
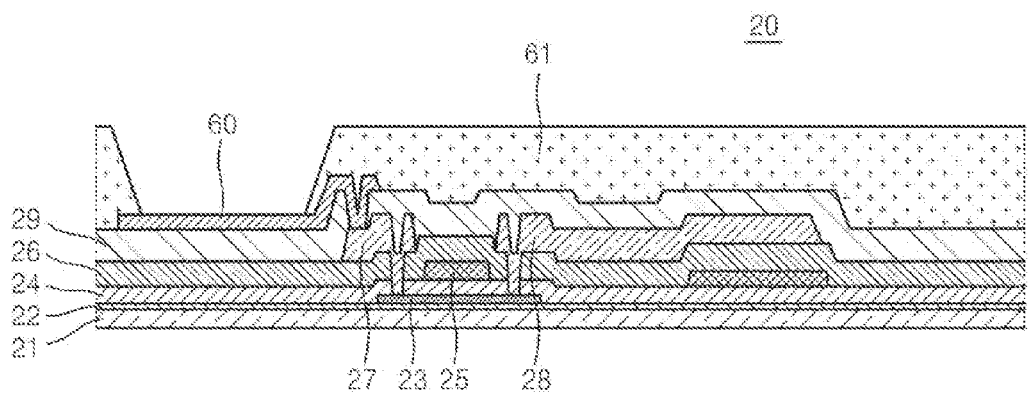

FIG. 5 shows the patterning substrate 20 in detail according to an embodiment of the present invention. An organic light emitting layer is patterned on a pixel electrode 60 so that an active matrix (AM) type OLED may be fabricated by using the patterning substrate 20. According to the embodiment of the present invention, the patterning substrate 20 may have a structure, in which a buffer insulating layer 22 is stacked on a glass substrate 21. An active layer 23 is formed on the buffer insulating layer 22. A gate insulating 24 covers the active layer 23. The active layer 23 may have a poly-si structure after a-si is deposited and then a crystallization process is performed.

In addition, a gate electrode 25 is formed on the gate insulating layer 24, an interlayer dielectric 26 is stacked on the gate electrode, and then a drain electrode 27 and a source electrode 28 are formed on the interlayer dielectric 26. The drain electrode 27 and the source electrode 28 contact the active layer 23 by penetrating through the interlayer dielectric 26, and may be covered by a passivation layer 29. Here, the drain electrode 27 is connected to the pixel electrode 60 that is formed on the passivation layer 29 so as to transfer an output voltage of a thin film transistor (TFT) to the pixel electrode 60.

In addition, a pixel definition layer 61 is formed on top of the stacked substrate to have the pixel electrode 60 exposed. An organic light emitting layer is patterned on the exposed pixel electrode 60. After the organic light emitting layer is patterned, a second electrode (not shown) is formed on the organic light emitting layer in a direction to cross the pixel electrode 60, thereby completing the OLED. In the shown embodiment, as illustrated in FIG. 5, the patterning substrate 20 is used in a state before the organic light emitting layer is patterned, and the organic light emitting layer may be formed on the pixel electrode 60 that is opened, in a pattern forming process that will be described later.

The patterning substrate 20 is aligned on a surface of the heating substrate 10, as illustrated in FIG. 4. The heating substrate 10 is aligned to correspond to a position of a pattern to be formed on the patterning substrate 20, and also, so that the pattern forming material that is vaporized by the heat generated from the heating substrate 10 may be deposited again on the patterning substrate 20 to form the pattern on the patterning substrate 20.

Figure 6:
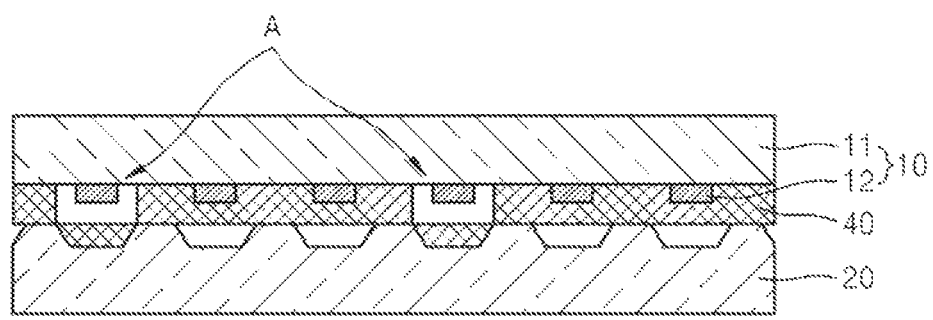

Then, as illustrated in FIG. 6, current is selectively applied to the heating substrate 10 to transfer some of the pattern forming material 40 attached on the heating substrate 10 onto the patterning substrate 20. In a state in which the patterning substrate 20 and the heating substrate 10 are aligned, as current is selectively applied to the heating substrate 10, an electric resistant heat is generated only at positions A corresponding to the position where the current flows through the heating lines 12 as illustrated in FIG. 6. The pattern forming material 40 is locally heated on the portions where the heat is generated in the heating substrate 10. Accordingly, the pattern forming material 40 is vaporized and deposited on the pattern substrate 20 again. The deposited pattern forming material 40 is transferred to the patterning substrate 20 at the desired positions to form the pattern (that is, the pattern of the organic light emitting layer) without depositing the pattern at other positions for other colors.

Thus, the pattern of the electric heating lines 12 may correspond to the pattern that is to be formed on the patterning substrate 20. That is, the electric heating lines 12 may be formed as a pattern that may generate the heat on the location of the pattern that will be formed on the patterning substrate 20. Further, the lines 12 can be selectively used so as to only deposit specific patterns.

Figure 7:
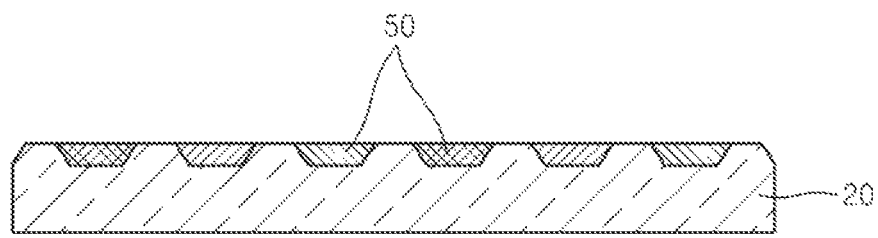

The processes illustrated in FIGS. 2 through 6 are repeatedly performed to transfer the pattern 50 selectively onto the desired positions of the patterning substrate 20 as shown in FIG. 7, and the material forming the pattern may be selected.

When one of red, green, and blue light emitting layers of the OLED is formed in the above method, the electric heating lines 12 are formed in a pattern corresponding to all red, green, and blue pixels. Then, to form a red light emitting layer, an electric current is applied to the electric heating lines 12 corresponding to the red pixels to deposit the red pattern forming material. Also, to form a green light emitting layer, an electric current is applied to the electric heating lines 12 corresponding to the green pixels to deposit the green pattern forming material. To form a blue light emitting layer, an electric current is applied to the electric heating lines 12 corresponding to the blue pixels to deposit the blue pattern forming material. While not described, it is understood that, after each pattern is formed, the pattern forming material 40 is exchanged for another material forming another color. As a result, the red, green, and blue light emitting layers may be sequentially formed.

In the above description of the embodiment of the present invention, the process for forming the pattern 50 of an organic layer needed for manufacturing an OLED is described. In manufacturing the OLED, since the organic layer is very weak to moisture, the organic layer should be completely isolated from moisture during and after the manufacturing process. Accordingly, a photolithography method in which the organic layer is exposed to moisture in a resist separation process and an etching process is not suitable for the process for forming an organic layer pattern. Thus, the embodiments of the present invention may be effectively employed for manufacturing a large OLED because the organic layer is patterned without contact of moisture and a mask sagging phenomenon is removed.

The above-described pattern forming process may be applied in various ways to the pattern forming process in which a wet process is difficult to employ. That is, the embodiments of the present invention may be employed in a process for forming a circuit pattern of a printed circuit board by using a conductive pattern forming material to the patterning substrate formed of an insulation material. Also, the embodiments of the present invention may be employed to a process for forming a pattern by using a mask in a deposition or sputtering method.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a pattern, the method comprising:
providing a heating substrate that selectively controls positions where heat is generated by controlling locations where an electric current flows, wherein the heating substrate comprises a plurality of electric heating lines;
forming a pattern forming material on a surface of the heating substrate;
aligning a patterning substrate, on which a pattern is to be formed, to face and directly contact the formed pattern forming material on the surface of the heating substrate; and
selectively applying the electric current to the heating substrate to transfer some of the pattern forming material onto the patterning substrate to form the pattern, the selectively applying the electric current comprising the electric current selectively flowing in ones of the plurality of the electric heating lines,
wherein a thickness of the plurality of the electric heating lines varies according to locations of the heating substrate.

2. The method of claim 1, wherein the selectively applying the electric current comprises the ones of the plurality of electric heating lines through which the electric current flows generating the heat at locations corresponding to the pattern to be formed on the patterning substrate.

3. The method of claim 1, wherein the forming the pattern forming material on the heating substrate comprises depositing or sputtering the pattern forming material on the heating substrate.

4. The method of claim 1, wherein the selectively applying the electric current comprises vaporizing the pattern forming material using the heat generated in the heating substrate.

5. A method of fabricating an organic light emitting device (OLED), the method comprising:
providing a heating substrate that selectively controls positions where heat is generated by controlling locations where an electric current flows, wherein the heating substrate comprises a plurality of electric heating lines;
forming a pattern forming material on a surface of the heating substrate;
aligning a patterning substrate, on which a plurality of pixel electrodes are formed, to face the formed pattern forming material on the surface of the heating substrate; and
selectively applying the electric current to the heating substrate to transfer some of the pattern forming material onto ones of the plurality of pixel electrodes on the patterning substrate, the selectively applying the electric current comprising the electric current selectively flowing in ones of the plurality of the electric heating lines,
wherein a thickness of the plurality of the electric heating lines varies according to locations of the heating substrate.

6. The method of claim 5, wherein the selectively applying the electric current comprises the plurality of electric heating lines through which the electric current flows generating the heat at locations corresponding to the ones of the plurality of pixel electrodes on the patterning substrate.

7. The method of claim 5, wherein the forming of the pattern forming material on the heating substrate comprises depositing or sputtering the pattern forming material on the heating substrate.

8. The method of claim 5, wherein the selectively applying the electric current comprises vaporizing the pattern forming material using the heat generated in the heating substrate.

9. A method of forming a pattern, the method comprising:
   forming a pattern forming material on a surface of a heating substrate, wherein the heating substrate comprises a plurality of electric heating lines;
   aligning a patterning substrate to face and directly contact the formed pattern forming material such that the patterning substrate directly contacts the pattern forming material; and
   selectively heating the surface of the heating substrate to selectively transfer portions of the pattern forming material onto the patterning substrate while leaving other portions on the surface of the heating substrate, the selectively heating comprises electric current selectively flowing in ones of the plurality of the electric heating lines,
   wherein the thickness of the plurality of the electric heating lines varies according to locations of the heating substrate.

10. The method of claim 9, wherein the pattern forming material comprises an organic compound used to form an organic light emitting layer on the patterning substrate.

11. The method of claim 9, wherein the forming the pattern forming material comprises using a deposition method to apply the pattern forming material on the surface of the heating substrate.

12. The method of claim 9, wherein the forming the pattern forming material comprises using a sputtering method to apply the pattern forming material on the surface of the heating substrate.

13. The method of claim 9, wherein the selectively heating the surface comprises selectively transferring the pattern forming material on the patterning substrate to form light emitting elements of an organic light emitting device (OLED).

14. The method of claim 13, wherein the selectively heating the surface comprises:
   selectively activating only a first group of heating elements on the surface of the heating substrate to transfer a first color light emitting layers of the OLED onto first portions of the patterning substrate; and
   selectively activating only a second group of the heating elements on the surface of the heating substrate to transfer another color light emitting layer of the OLED onto second portions of the patterning substrate.

15. The method of claim 14, further comprising, after selectively activating only the first group and prior to selectively activating only the second group, removing any remaining pattern forming material to expose the surface of the heating substrate, and applying another pattern forming material on the exposed surface of the heating substrate.

\* \* \* \* \*